US009198266B2

(12) United States Patent
Yem et al.

(10) Patent No.: US 9,198,266 B2
(45) Date of Patent: Nov. 24, 2015

(54) OPTICAL NAVIGATION SENSOR WITH INTEGRATED CHARGE PUMP

(71) Applicant: PixArt Imaging (Penang) SDN. BHD., Penang (MY)

(72) Inventors: Poh Weng Yem, Penang (MY); Shan Chong Tan, Penang (MY); Keng Yeam Chang, Penang (MY)

(73) Assignee: PixArt Imaging (Penang) SDN. BHD., Phase III Bayan Lepas Free Industrial Zone, Penang (MY)

( * ) Notice: Subject to any disclaimer, the term of this patent is extended or adjusted under 35 U.S.C. 154(b) by 0 days.

(21) Appl. No.: 14/258,043

(22) Filed: Apr. 22, 2014

(65) Prior Publication Data

US 2015/0305127 A1    Oct. 22, 2015

(51) Int. Cl.
*H05B 37/03*      (2006.01)
*H01S 5/0683*    (2006.01)
*H05B 33/08*      (2006.01)

(52) U.S. Cl.
CPC .............. *H05B 37/03* (2013.01); *H01S 5/0683* (2013.01); *H05B 33/0887* (2013.01)

(58) Field of Classification Search
USPC ................. 372/29.012, 29.015, 29.021, 38.1, 372/38.02, 38.04
See application file for complete search history.

(56) References Cited

U.S. PATENT DOCUMENTS 7,471,282 B2    12/2008  Lin
2002/0171467 A1*   11/2002  Worley et al. ................. 327/514

FOREIGN PATENT DOCUMENTS

TW    201106794    2/2011
TW    201143519    12/2011
TW    201405379    2/2014

\* cited by examiner

*Primary Examiner* — Dung Nguyen
(74) *Attorney, Agent, or Firm* — Winston Hsu; Scott Margo

(57) ABSTRACT

An optical navigation sensor includes: a driving circuit and a charge pump. The driving circuit is employed for driving a light source externally connected to the optical navigation sensor. The charge pump is employed for intermittently performing an operation of providing a first supply voltage to the light source. When the driving circuit drives the light source, the charge pump does not perform the operation of providing the first supply voltage to the light source.

16 Claims, 4 Drawing Sheets

OPTICAL NAVIGATION SENSOR WITH INTEGRATED CHARGE PUMP

BACKGROUND OF THE INVENTION

1. Field of the Invention

The present invention relates generally to optical navigation, and more particularly, to an optical navigation sensor which includes an integrated charge pump for providing a supply voltage to a light source and a method of providing the supply voltage to the light source.

2. Description of the Prior Art

In a conventional optical navigation system, at least two direct current-to-direct current (DC-DC) boost converters are required to provide electrical power to internal components of the optical navigation system, one of which provides a supply voltage to an optical navigation sensor of the optical navigation system, and the other of which provides another higher supply voltage to a light source of the optical navigation system.

Please refer to FIG. 1, which schematically illustrates a conventional optical navigation system 10. External DC-DC boost converters 110 and 120 coverts power supplied by a battery 160 to generate supply voltages VDD1 and VDD2, to a driving circuit 130 of an optical navigation sensor 100 and a light source 140, respectively. In addition, to detect whether a fault event that a terminal of the light source 140 is improperly shorted to the ground occurs, a sensing circuit 150 is required. Such fault event may cause a large current to flow through the light source 140, thereby making the light source 140 to generate too strong light that may be harmful to user's eye. When the sensing circuit 150 detects the fault event, the sensing circuit 150 informs the driving circuit 130. The driving circuit 130 accordingly issues a control signal LSR_NEN to turn off a switch SW1 connected between the light source 140 and the supply voltage VDD2. When the path between the supply voltage VDD2 and the light source 140 is cut off, the light source 140 is unable to emit the light, thereby assuring the safety of user's eye.

However, there are two problems in such design. First, the external DC-DC boost converter 120 consumes considerably large power because the DC-DC booster converter 120 stays active all the time. Second, a control pin for transmitting the control signal LSR_NEN to turn off the switch SW1 is necessary. However, this increases the pin count of optical navigation sensor 100 and leads to the increasing of the hardware cost. Additionally, the requirement of switch SW1 also leads to the increasing of the hardware cost.

SUMMARY OF THE INVENTION

With this in mind, it is one objective of the present invention to provide an optical navigation sensor having an integrated charge pump and a method of providing a supply voltage to a light source. In the present invention, the charge pump intermittently operates to provide a supply voltage to the light source, which consumes less power compared to the conventional art. In addition, the fault event is addressed by stopping the charge pump from providing the supply voltage to the light source. Therefore, no control pin and switches are required. As a result, the present invention advantageously reduces the power consumption and the hardware cost.

In a first aspect of the present invention, there is provided an optical navigation sensor comprising: a driving circuit and a charge pump. The driving circuit is employed for driving a light source externally connected to the optical navigation sensor. The charge pump is employed for intermittently performing an operation of providing a first supply voltage to the light source. When the driving circuit drives the light source, the charge pump stops the operation of providing the first supply voltage to the light source.

In a second aspect of the present invention, there is provided a method of providing a supply voltage to a light source regarding an optical navigation sensor, comprising: utilizing a charge pump in the optical navigation sensor to provide a first supply voltage to the light source; and stopping providing the first supply voltage to the light source when driving the light source.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
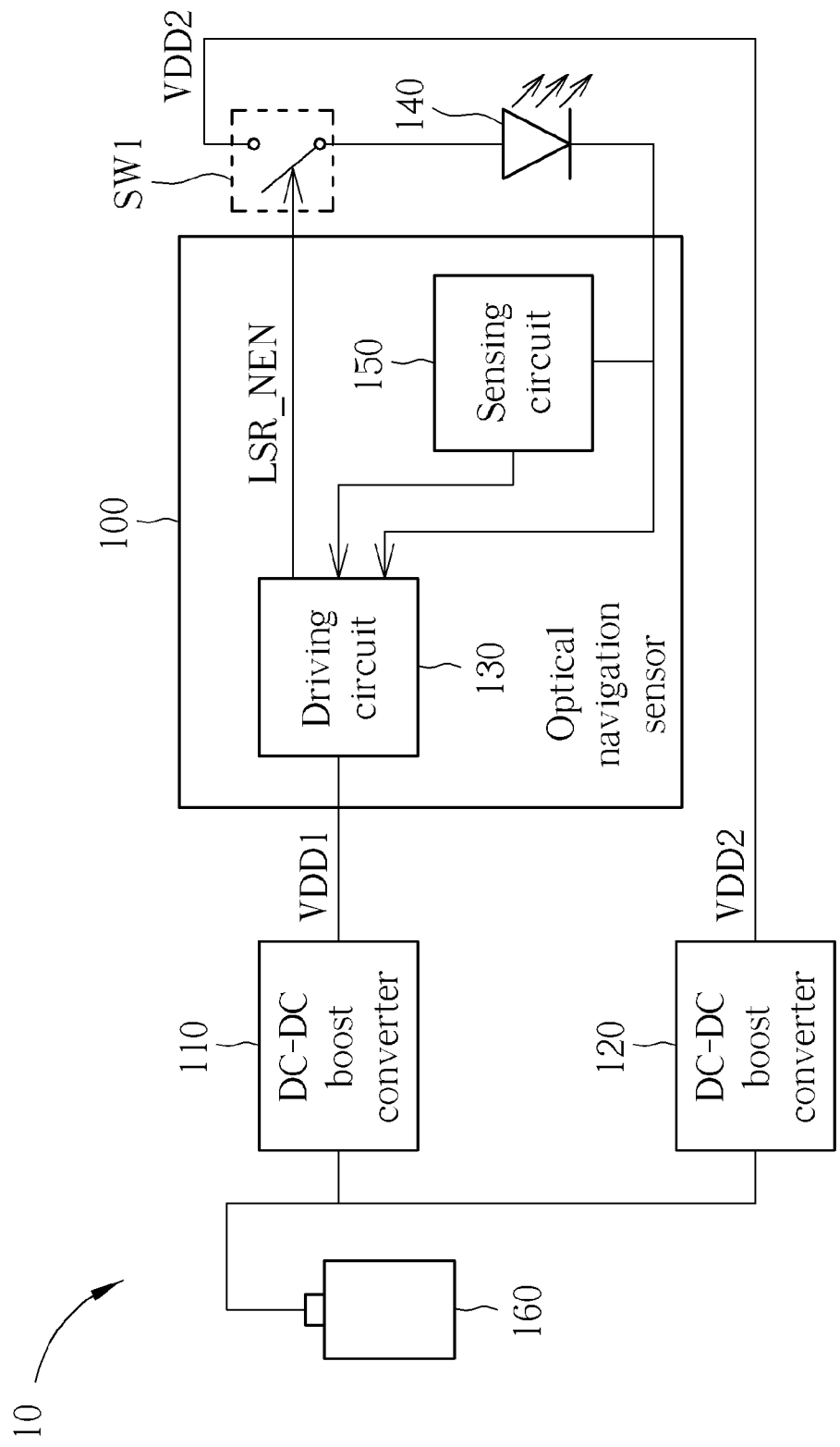
FIG. 1 illustrates a diagram regarding how a light source and an optical navigation sensor are powered in a conventional way.
Figure 2:
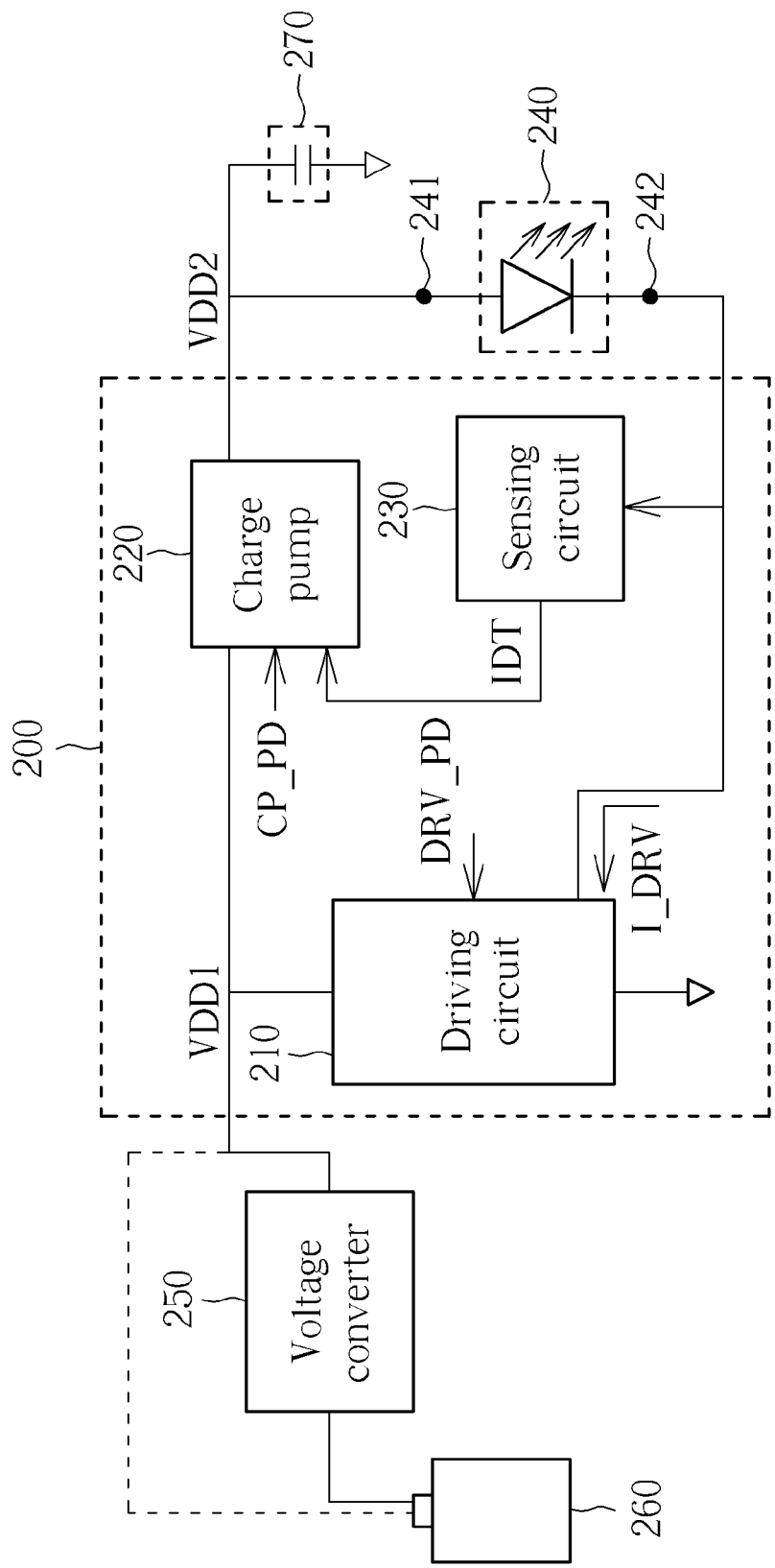
FIG. 2 illustrates a schematic diagram of an optical navigation sensor having a charge pump according to one exemplary embodiment of the present invention.

Please refer to FIG. 2, which schematically illustrates an optical navigation sensor according to one exemplary embodiment of the present invention. As shown, the optical navigation sensor 200 comprises a driving circuit 210 and a charge pump 220. The optical navigation sensor 200 captures images regarding reflection caused by a light source 240 emits light on a surface on which an object (not shown) to be tracked by the optical navigation sensor 200 moves. The optical navigation sensor 200 then analyzes the captured images to determine movement information of the object.

An external voltage converter 250, such as a DC-DC boost converter, is used to convert electrical power supplied by a battery 260 (or other types of power supplying devices) as a supply voltage VDD1. However, according to various embodiments of the present invention, the supply voltage VDD1 may be directly supplied by the battery 260 without the conversion of the voltage converter 250. The supply voltage VDD1 is provided to internal components of the optical navigation sensor 200. The supply voltage VDD1 may be directly provided to the driving circuit 210 or via other intermediate regulators (not shown). Further, the supply voltage VDD1 is also provided to the charge pump 220. The charge pump 220 operates to convert the supply voltage VDD1 to a supply voltage VDD2. The supply voltage VDD2 will be provided to the light source 240. The supply voltage VDD2 and a driving current I_DRV from the driving circuit 210 are supplied to enable the light source 240 to emit the light. Accordingly, the optical navigation sensor 200 captures images regarding reflection caused by the light. In one embodiment, the light source 240 may be a vertical-cavity surface-emitting laser (VCSEL). However, it is also possible to use other types of light sources, such as a light-emitting diode (LED), to provide the light in various embodiments of the present invention.

Based on the principles of the charge pump 220, the supply voltage VDD2 provided by the charge pump 220 is variable rather than constant, which may introduces undesired noises to image capturing process that is conducted by the optical navigation sensor 200. To avoid the optical navigation sensor 200 from capturing noisy images, the charge pump 220 intermittently operates to provide the supply voltage VDD2 to the light source 240.

Figure 3:
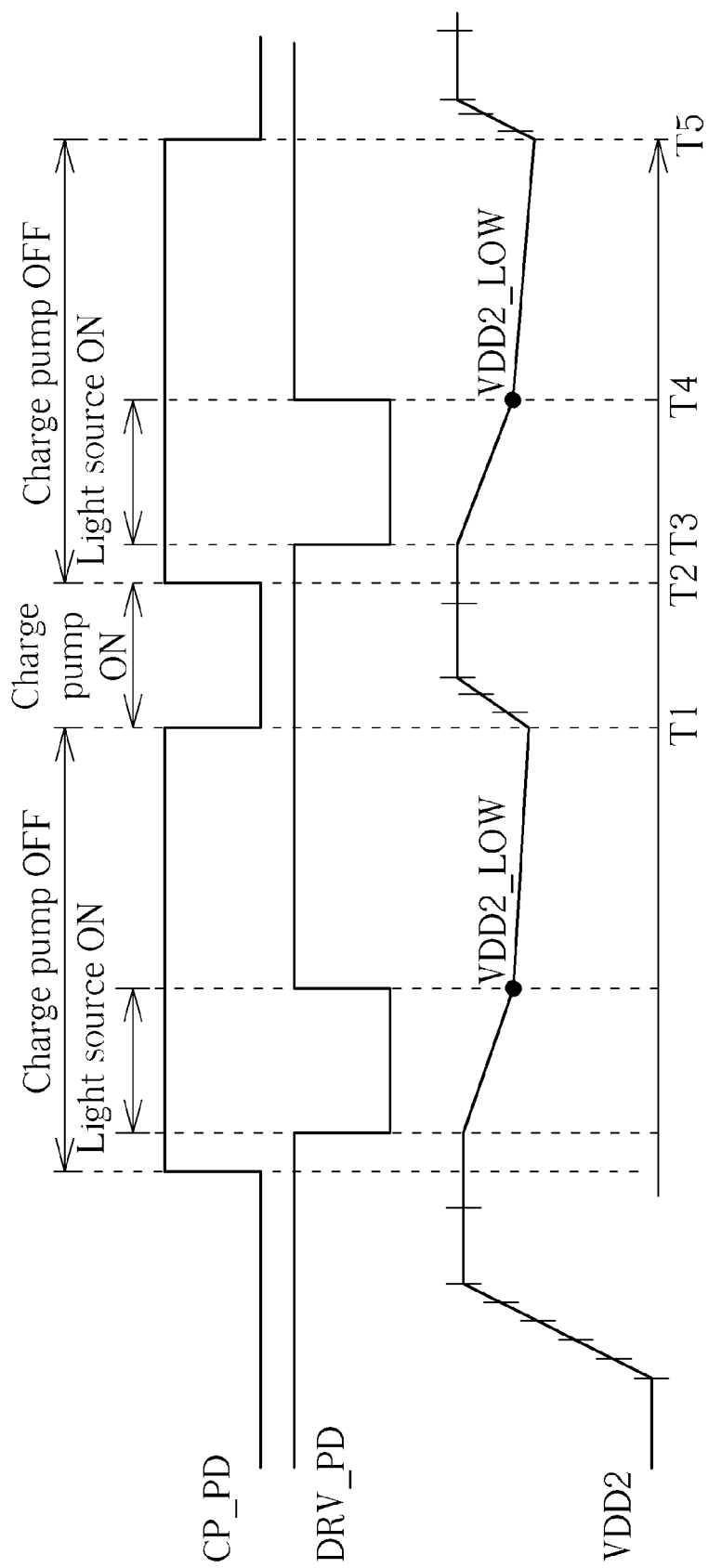
FIG. 3 illustrates a timing chart regarding operating states of the driving circuit and the light source of the optical navigation sensor shown in FIG. 2 according to one exemplary embodiment of the present invention.

Please refer to FIG. 3, which illustrates a timing diagram regarding operations of the driving circuit 210 and the charge pump 220. In this diagram, two active-low control signals CP_PD and DRV_PD for respectively controlling the charge pump 220 and the driving circuit 210, are used to exemplarily represent operating states of the driving circuit 210 and the charge pump 220. At time T1, the control signal CP_PD for controlling the charge pump 220 is de-asserted, and the charge pump 220 accordingly starts operating to provide the supply voltage VDD2, and the supply voltage VDD2 will be increased to a steady level during a period between time T1 and time T2. Meanwhile, the control signal DRV_PD for controlling the driving circuit 210 remains asserted, which makes the driving circuit 210 not provide the driving current I_DRV for the light source 240 and the light source 240 cannot emit the light at this time. At time T2, as the level of the supply voltage VDD2 has been brought up to the steady level, the control signal CP_PD for controlling the charge pump 220 is asserted. At this time, the charge pump 220 stops operating and will not provide the supply voltage VDD2 to the light source 240. Moreover, a capacitor 270 that is connected to the light source 240 and the charge pump 220 is charged to a maximum level of the supply voltage VDD2 during the period between time T1 and time T2. From time T2, the capacitor 270 is used to maintain a level of a terminal 241 of the light source 240 as possibly. Then, the control signal DRV_PD is de-asserted at time T3, and the driving circuit 210 starts providing the driving current I_DRV for the light source 240. Also, the light source 240 is forwardly biased with the voltage held by the capacitor 270. Therefore, the light source 240 starts to emit the light.

From time T3 to time T4, the optical navigation sensor 200 captures the images. Meanwhile, the control signal CP_PD remains asserted and the charge pump 220 does not operate to provide the supply voltage VDD2 to avoid introducing noises to the captured images. Also, the level of the terminal 241 is maintained by the capacitor 270 to make the light source 240 forwardly biased such that it is able to continuously emit the light. The capacitance of the capacitor 270 is selectable to assure a minimum level VDD2_LOW of the supply voltage VDD2 is greater than a voltage required by forwardly biasing the light source 240. After time T4, the optical navigation sensor 200 finishes capturing the images. Therefore, the control signal DRV_PD is asserted and the driving circuit 210 stops providing the driving current I_DRV for the light source 240. Until time T5 comes, the control signals CP_PD and DRV_PD remain asserted. Meanwhile, the driving circuit 210 does not provide the driving current I_DRV, and the charge pump 220 stops operating to provide the supply voltage VDD2. Therefore, the charge pump 220 does not need to stay active all the time, which significantly reduces the power consumption.

In one embodiment, the optical navigation sensor 200 further includes a sensing circuit 230 as shown in FIG. 2. The sensing circuit 230 is employed for detecting whether a fault event that a terminal 242 of the light source 240 is improperly shorted to a ground occurs. If this fault event occurs, a large current will flow through the light source 240 such that the light emitted by the light source 240 will become harmful to user's eye. Therefore, an undesired eye safety issue is introduced. To address the fault event, the present invention allows the charge pump 220 to stop operating when the fault event is detected. The sensing circuit 230 detects a level of the terminal 242 of the light source 240. Once it is found the level of the terminal 242 is close to zero, the sensing circuit 230 determines the fault event occurs and generates an indication signal IDT to inform the charge pump 220 of the fault event. When the charge pump 220 receives the indication signal IDT, the charge pump 220 stop operating and the supply voltage VDD2 will not be provided to the light source 240. As a result, the current flowing through the light source 240 will be ceased. Since the present invention ceases the current flowing through the light source 240 by stopping providing the supply voltage VDD2 to the light source 240, control pins and switches conventionally required by the optical navigation system 10 are saved in the present invention.

Figure 4:
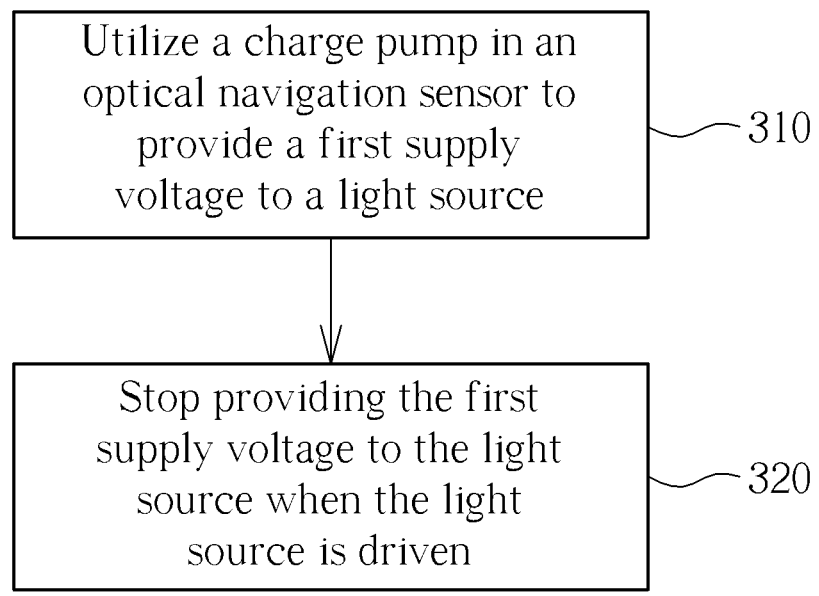
FIG. 4 illustrates a flow chart of a method for providing supply voltage to a light source regarding an optical navigation sensor according to one exemplary embodiment of the present invention.

According to one exemplary embodiment of the present invention, a method regarding how a charge pump of an optical navigation sensor provides a supply voltage to a light source is further provided. Please refer to FIG. 4, which illustrates a flow chart of the method of the present invention. At first, in step 310, the charge pump (e.g. charge pump 220) is utilized for providing a first supply voltage (e.g. VDD2) to a light source (e.g. light source 240). Then, in step 320, the operation of the charge pump is stopped and the light source is driven when the providing of the first supply voltage is stopped. Accordingly, the light source emits the light on a surface on which an object to be tracked by the optical navigation sensor moves. At this time, the optical navigation sensor starts capturing images regarding reflection caused by light emitted by the light source. As the providing of the first supply voltage for the light source has been stopped, the optical navigation sensor can derive images without noises. In one embodiment, the first supply voltage may be generated from a second supply voltage (e.g. VDD1) provided by a voltage converter or a battery externally connected to the optical navigation sensor.

Moreover, before the providing of the first supply voltage is stopped in step 320, a level of the first supply voltage is increased to a specific value that is greater than a level of a bias voltage that is required to enable the light source to emit light. As a result, the light source is able to emit the light even though the providing of the supply voltage has been stopped.

In one embodiment, the method of the present invention further comprises steps of: detecting whether a fault event regarding the light source occurs; and stopping providing the first supply voltage to the light source when the fault event is detected. As the providing of the supply voltage is stopped when the fault event occurs, the safety of user's eye can be assured.

In conclusion, the present invention employs the charge pump integrated in the optical navigation sensor to control the operations of the light source. The charge pump increases the level of the supply voltage before the light source is driven by the driving circuit. Once the light source is driven by the driving circuit, the operation of the charge pump is stopped, and the capacitor takes over the providing of the supply voltage for forwardly biasing the light source. That is, the charge pump of the present invention intermittently provides the supply voltage, which significantly reduces the power consumption. Compared to this, in the conventional art, the external DC-DC boost converter stays active all the time, which consumes considerably higher electrical power than the present invention does.

Also, in the conventional art, the providing of the supply voltage to the light source is stopped by switches and corresponding control signals when the fault event occurs. Compared to this, the present invention stops the providing of the supply voltage to the light source by just stopping the operation of the charge pump. Hence, no switch and no control pin are required, thereby saving the hardware costs and also simplifying the circuit complexity of the optical navigation sensor.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical navigation sensor, comprising:
    a driving circuit, for driving a light source externally connected to the optical navigation sensor; and
    a charge pump, for intermittently performing an operation of providing a first supply voltage to the light source;
    wherein when the driving circuit drives the light source, the charge pump stops the operation of providing the first supply voltage to the light source; and when the optical navigation sensor captures images regarding reflection caused by light emitted by the light source, the charge pump stops the operation of providing the first supply voltage to the light source.

2. The optical navigation sensor of claim 1, wherein before the driving circuit drives the light source, the charge pump starts the operation of providing the first supply voltage to the light source.

3. The optical navigation sensor of claim 1, wherein when the driving circuit stops driving the light source, the charge pump stops the operation of providing the first supply voltage to the light source.

4. The optical navigation sensor of claim 1, further comprising:
    a sensing circuit, coupled to the charge pump, for detecting whether a fault event regarding the light source occurs, wherein when the fault event is detected, the sensing unit generates an indication signal, and the charge pump stops the operation of providing the first supply voltage according to the indication signal.

5. The optical navigation sensor of claim 4, wherein the fault event represents a current flowing through the light source exceeds a threshold level.

6. The optical navigation sensor of claim 1, wherein the light source is a vertical-cavity surface-emitting laser (VCSEL) or a light-emitting diode (LED).

7. A method of providing a supply voltage to a light source regarding an optical navigation sensor, comprising:
    utilizing a charge pump in the optical navigation sensor to provide a first supply voltage to the light source; and
    stopping providing the first supply voltage to the light source when the light source is driven;
    wherein the step of providing the first supply voltage to the light source is stopped when the optical navigation sensor captures images regarding reflection caused by light emitted by the light source.

8. The method of claim 7, wherein the step of providing the first supply voltage to the light source is started before the light source is driven.

9. The method of claim 7, wherein the step of providing the first supply voltage to the light source is stopped when the light source is not driven.

10. The method of claim 7, further comprising:
    detecting whether a fault event regarding the light source occurs; and
        stopping providing the first supply voltage to the light source when the fault event is detected.

11. The method of claim 10, wherein the fault event represents a current flowing through the light source exceeds a threshold level.

12. The method of claim 7, wherein the light source is a vertical-cavity surface-emitting laser (VCSEL) or a light-emitting diode (LED).

13. An optical navigation sensor, comprising:
    a driving circuit, for driving a light source externally connected to the optical navigation sensor; and
    a charge pump, for intermittently performing an operation of providing a first supply voltage to the light source;
    wherein when the driving circuit drives the light source, the charge pump stops the operation of providing the first supply voltage to the light source; when the charge pump operates to provide the first supply voltage; and the first supply voltage is increased to a specific voltage level that is greater than a bias voltage that is required to enable the light source to emit light.

14. An optical navigation sensor, comprising:
    a driving circuit, for driving a light source externally connected to the optical navigation sensor; and
    a charge pump, for intermittently performing an operation of providing a first supply voltage to the light source;
    wherein when the driving circuit drives the light source, the charge pump stops the operation of providing the first supply voltage to the light source; and the charge pump converts a second supply voltage that is provided by a voltage converter or a battery externally connected to the optical navigation sensor as the first supply voltage.

15. A method of providing a supply voltage to a light source regarding an optical navigation sensor, comprising:
    utilizing a charge pump in the optical navigation sensor to provide a first supply voltage to the light source, comprising:
        increasing a level of the first supply voltage to a specific value that is greater than a level of a bias voltage that is required to enable the light source to emit light; and
    stopping providing the first supply voltage to the light source when the light source is driven.

16. A method of providing a supply voltage to a light source regarding an optical navigation sensor, comprising:
    utilizing a charge pump in the optical navigation sensor to provide a first supply voltage to the light source, comprising:
        converting a second supply voltage that is provided by a voltage converter or a battery externally connected to the optical navigation sensor as the first supply voltage; and
    stopping providing the first supply voltage to the light source when the light source is driven.

\* \* \* \* \*